United States Patent
Moretti et al.

(10) Patent No.: US 10,965,254 B2
(45) Date of Patent: Mar. 30, 2021

(54) LOW NOISE AMPLIFIER CIRCUIT FOR A THERMAL VARYING RESISTANCE

(71) Applicant: STMicroelectronics S.r.l., Agrate Brianza (IT)

(72) Inventors: Mattia Fausto Moretti, Monza (IT); Paolo Pulici, Legnano (IT); Alessio Facen, Macerata (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 130 days.

(21) Appl. No.: 16/392,009

(22) Filed: Apr. 23, 2019

(65) Prior Publication Data

US 2019/0372529 A1 Dec. 5, 2019

(30) Foreign Application Priority Data

Jun. 4, 2018 (IT) .................. 102018000006016
Jun. 4, 2018 (IT) .................. 102018000006020

(51) Int. Cl.
*G11B 5/09* (2006.01)
*H03F 1/26* (2006.01)
*H03F 3/45* (2006.01)

(52) U.S. Cl.
CPC ........... *H03F 1/26* (2013.01); *H03F 3/45192* (2013.01)

(58) Field of Classification Search
CPC .................................. G11B 5/09; H03F 1/26
See application file for complete search history.

(56) References Cited

U.S. PATENT DOCUMENTS

| 5,191,297 | A | 3/1993 | Penman et al. |
| 5,367,411 | A | 11/1994 | Nishiyama et al. |
| 6,222,415 | B1 | 4/2001 | Umeyama et al. |
| 7,301,715 | B2 | 11/2007 | Huang et al. |
| 7,327,103 | B1 | 2/2008 | Ei-Sadi |
| 8,792,198 | B1 | 7/2014 | Straub et al. |
| 8,988,816 | B1 | 3/2015 | Yamasaki |
| 9,437,219 | B1* | 9/2016 | Wilson ..................... G11B 5/09 |
| 2004/0056722 | A1* | 3/2004 | Sutardja .................... H03F 1/34 330/295 |
| 2010/0060249 | A1* | 3/2010 | Ueda ....................... G05F 1/573 323/280 |
| 2011/0157736 | A1 | 6/2011 | Contreras et al. |
| 2012/0250484 | A1 | 10/2012 | Polley et al. |
| 2013/0163110 | A1 | 6/2013 | Garzon et al. |

(Continued)

*Primary Examiner* — Patricia T Nguyen
(74) *Attorney, Agent, or Firm* — Slater Matsil, LLP

(57) ABSTRACT

A circuit arrangement, including: a circuit configured to synthesize a resistor having a resistance value having a variation in time equivalent to a resistance variation of a sensor resistor applied with a resistance bias voltage and a resistance current bias, wherein the circuit includes: an amplifier comprising an input transistor; a bias current generator comprising a control node coupled to an output of the input transistor, wherein the bias current generator is configured to generate a bias current flowing in the input transistor; and a further current generator configured to generate a current at least proportional to the resistance bias current and coupled to the output of the input transistor, wherein the resistance bias voltage is applied to an input of the amplifier, and wherein a transconductance of the input transistor is at least proportional to the resistance of the sensor resistor.

19 Claims, 15 Drawing Sheets

(56) References Cited

U.S. PATENT DOCUMENTS

| | | | |
|---|---|---|---|
| 2013/0176639 A1 | 7/2013 | Polley et al. | |
| 2014/0340150 A1* | 11/2014 | Dempsey | H03F 1/223 330/260 |
| 2015/0249434 A1* | 9/2015 | Ogawa | G01R 27/02 73/504.02 |
| 2017/0025951 A1* | 1/2017 | Gambetta | G01R 19/0092 |

* cited by examiner

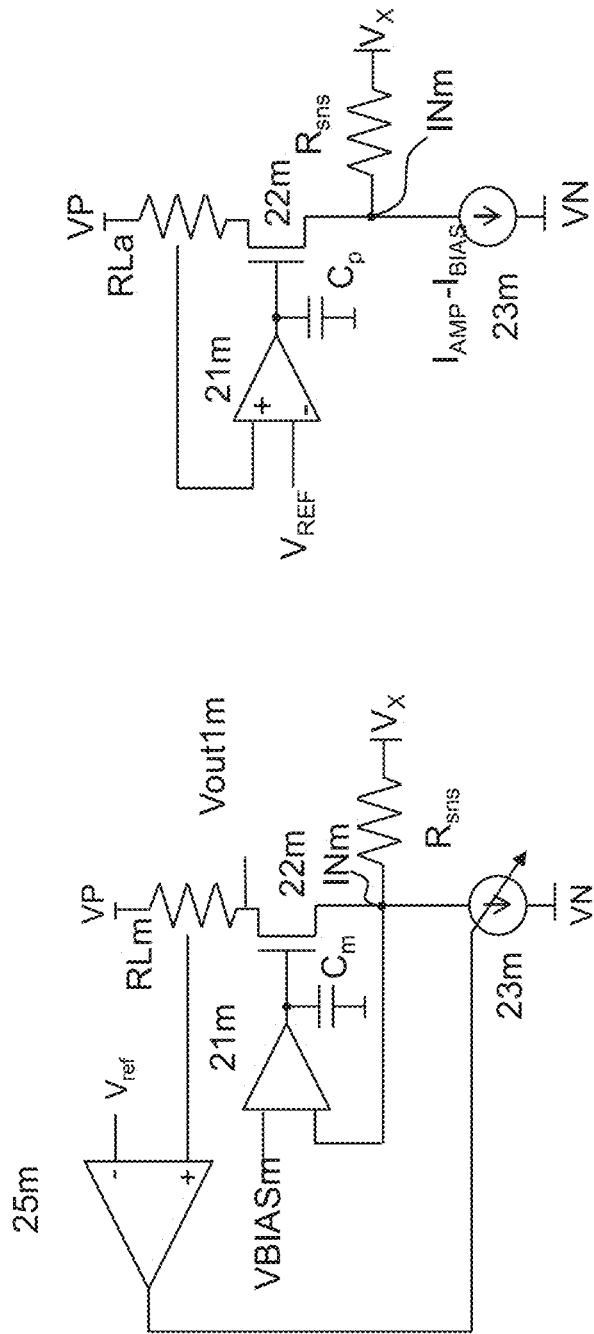

LOW NOISE AMPLIFIER CIRCUIT FOR A THERMAL VARYING RESISTANCE

CROSS-REFERENCE TO RELATED APPLICATIONS

This application claims priority to Italian Patent Application No. 102018000006016, filed on Jun. 4, 2018, and Italian Patent Application No. 102018000006020, filed on Jun. 4, 2018, which applications are hereby incorporated herein by reference.

TECHNICAL FIELD

Embodiments of the present disclosure relate generally to amplifiers, and in particular embodiments to a low noise amplifier circuit for thermal varying resistance.

BACKGROUND

With the increasing data densities in Hard Disk Drives, sensing and control of the fly height of the tip over the disk is required.

A sensor represented by a thermal varying resistor, placed on the read and write head, is used to monitor the fly height between head and media. The sensor has to be properly biased with a constant voltage across it (or a constant current through it); when the head approaches to the disk the media acts as heat sinker and the sensor varies its resistance. This can be seen as a voltage signal generated inside the sensor, and this signal has to be filtered and amplified to have a precise detection of the fly height.

Signal is very small and detection needs to be accurate thus noise of the amplifier and filtering stage is critical: as well known the first stage of the amplifier is the most critical in terms of noise.

The first stage amplifier needs to:

apply a constant voltage to the sensor when voltage mode is selected;

apply a constant current through the sensor when current mode is selected;

amplify the signal coming from the resistance variation; have a band pass transfer function for the amplifier, in particular with high pass filter in the order of kHz and low pass filter in the order of tens of MHz.

The bias circuit has to work at very low frequency (bandwidth lower than the frequency pole of the minimum high pass filter) while the amplification circuit works on AC signals.

Therefore, in order to have a behavior as just described in a low noise amplifier for a thermal resistor varying its value in time according to the temperature variation, it is known to have in such first stage amplifier a bias circuit and an amplification circuit, separate with respect to the bias circuit.

This situation is shown schematically in FIG. 1 where a thermal resistor $R_{sns}$, e.g. a thermistor, representing a thermal varying resistance used as a sensor to monitor the fly height of a tip over a hard disk, supplies a sensor signal $S_{sns}$, present at its input terminals INp and INm. Such signal may be a sensor voltage or current occurring between such terminals and which variation is representative for instance of a temperature variation, to the two input terminals of a low noise amplifier first stage 10. The low noise amplifier first stage 10 includes a bias circuit 11 connected to the sensor signal $S_{sns}$ terminals INp and INm to apply a voltage or current bias on such sensor signal $S_{sns}$ and then an amplifying circuit 12 to amplify the biased sensor signal $S_{sns}$. A processing stage 99 may be arranged downstream the low noise amplifier first stage 10.

The bias circuit 11 has to be capable of driving significant currents and to be low noise, thus very big components are needed for this circuit. Moreover, the bandwidth has to be low too, i.e. the bias circuit cut-off frequency has to be low, in particular lower than the amplifier bandwidth, thus capacitors with a big size are needed.

In the same way, to have low noise and low high pass transfer function the amplifying circuit 12 which process the signal requires big components and capacitors too.

As it is shown, the requirements in terms of noise and bandwidths drive to very big stages with critical impacts in terms of area.

FIG. 2 shows a circuit implementing the prior art approach of FIG. 1, in voltage mode configuration. Two operational amplifiers 11m and 11p are used to apply the differential voltage across the sensor $R_{sns}$ according to a desired bias value VBIAS which corresponds to the difference of respective bias voltage VBIASP and VBIASM sent to the input of such operational amplifiers. Their outputs drive a respective NMOS transistor 15p and PMOS transistor 15m having their sources connected to the two terminals of the sensor resistor $R_{sns}$. The transistors 15m, 15p are used to carry the high bias current flowing through the sensor $R_{sns}$ and two capacitances $C_m$, $C_p$ connected between their gates and the respective differential supply terminal VP or VN, to cut the bias loop at very low frequencies. Two current generators 13m, 13p, generating a fixed current $I_x$, are used to bias the input pair of the amplifier 12.

In an amplifier as just described gain variation can be significant accordingly to the sensor process variability and application, i.e. the value of the sensor resistance, in particular, thermal varying resistance, changes and it is also affected by other uncertainties tied to the production process. Also the transconductance $g_m$ of the gain input stage (i.e. the bias output stage) could vary over process and temperature. This leads to the need to compensate the gain variability to obtain a flat gain over sensor resistance and process and temperature, which are however to some extent unknown.

The amplifiers as just described are representative of the more general problem of a device operating with a dependence from the value of a resistance, i.e. the sensor resistance, which varies in time, for instance with temperature and it is subject to known bias conditions. This can be the dependence of gain in a low noise amplifier for sensing and control of fly height of the tip in Hard Disk Drives, and or can be another application, e.g. an application picking up the signal formed on a sensor resistor, which resistance is varying in time, such as varying thermal resistance in temperature measuring circuits. Such general problem thus regards in general estimating an unknown resistance starting from its biasing condition.

In view of the above, it is an objective of the present disclosure to provide solutions which overcome one or more of the above drawbacks.

SUMMARY

In one or more embodiments, a circuit arrangement includes: a circuit for synthesizing a resistance having a value variation in time equivalent to the variation of the resistance of a resistor to which a resistance bias voltage and a resistance current bias are applied, Such circuit includes: an amplifier, including at least an input transistor, having a high impedance output, such high impedance output being coupled to the control node of a bias current generator of the input transistor generating a bias current flowing in the input transistor; and a further current generator issuing a current equal or proportional to the resistance bias current, coupled to the high impedance output, the resistance bias voltage of the resistor being applied to the input of the amplifier, so that the transconductance of the transistor is equal or proportional to the resistance of a resistor to which a resistance bias voltage and a resistance current bias are applied.

In variant embodiments, the amplifier is a differential amplifier and the at least an input transistor includes an input differential pair of transistors, the high impedance output of the differential amplifier being coupled to the control node of a bias current generator of the input differential pair of transistors generating a bias current flowing in the differential pair of transistors, the further current generator issuing a current equal or proportional to the resistance bias current being coupled to the high impedance output, the resistance bias voltage of the resistor being applied to the inputs of the differential amplifier, so that the transconductance of the differential pair of transistors is equal or proportional to the resistance.

The solution here described refers also to an amplifying circuit arrangement including the circuit arrangement of the above embodiments and further including: a first amplifier stage amplifying a signal formed on the resistor to which a resistance bias voltage and a resistance current bias are applied, in particular a sensor resistor; a gain recovery stage including a second amplifying stage including at least one transistor having its input electrode receiving the output of the first amplifier stage, the load electrode of the at least one transistor being connected to a respective load circuit including: a NMOS transistor which has scaled dimensions by a given scaling factor with respect to the dimensions of at least one amplifying transistor of the first amplifier stage and biased with a scaled current, by the scaling factor, with respect to the bias current of the transistors of the first amplifier stage; a circuit module including a resistance synthesizing transistor having given dimensions, in particular having the same dimensions of the at least one input transistor forming the input of the synthesizing circuit, and sinking a calibrated current to determine a transconductance value proportional to the inverse of the value of the resistance, the calibrated current corresponding to the bias current flowing in the input transistor of the circuit for synthesizing a resistance; and the other electrodes of the at least one transistor of the gain recovery stage being connected to a reference resistor.

In variant embodiments, the first amplifier stage includes a first differential amplifier stage amplifying a signal formed on the resistor to which a resistance bias voltage and a resistance current bias are applied. Furthermore, in variant embodiments, the gain recovery stage includes a second differential amplifying stage including a differential pair of transistors having its input electrodes receiving the differential outputs of the first differential pair, the load electrode of the differential pair being connected for each differential branch to a load circuit. The load circuit includes: a NMOS transistor which has scaled dimensions by a given scaling factor with respect to the dimensions of the transistor forming the first differential pair and biased with a scaled current, by the scaling factor, with respect to the bias current of the transistors of the first stage; a circuit module including a resistance synthesizing transistor having given dimensions, in particular having the same dimensions of a transistor of the differential pair of transistors forming the input of the synthesizing circuit, and sinking a calibrated current to determine a transconductance value proportional to the inverse of the value of the thermal resistor, the calibrated current corresponding to the bias current flowing in the differential pair of transistors of the circuit for synthesizing a resistance; and the other electrodes of the differential pair being connected to a reference resistor.

In variant embodiments, the first differential amplifier stage is configured as common gate amplifier and the resistance synthesizing circuit receives as input at least a gate voltage of the transistor forming the first differential pair and is configured to output the calibrated current.

In variant embodiments, the amplifying circuit arrangement includes a current generator connected between the positive voltage supply and the NMOS transistor emitting the calibrated current and a further current generator, connected between the NMOS transistor and the ground emitting a current corresponding to a fixed bias current of the differential pair of the first differential amplifier stage divided by the scaling factor.

In variant embodiments, the amplifier stage amplifying a signal formed on a varying resistor includes: a sensor varying resistor, in particular a thermal varying resistor; a low noise amplifier circuit connected to the sensor resistor to amplify a signal formed on the sensor resistor, the low noise amplifier circuit including a bias circuit portion configured to apply a bias voltage or a bias current to the sensor resistor, the bias circuit including a first transistor and a second transistor, each of the first and second transistor having their control electrode being driven by a respective first and second bias voltage, and connected respectively to each of the terminals of the sensor resistor to apply a differential bias voltage; and an amplifying circuit portion of the signal formed on the varying sensor resistor. The first and second transistor may be connected to form a differential pair of a differential amplifier having one electrode connected to a supply voltage through a respective load resistor and the other electrode connected to a respective terminal of the sensor resistor and to a respective current generator an output differential signal being collected on the electrodes connected to the load resistances. The amplifier stage may further include a respective low pass filtering component being provided connected to the input electrode so that over a determined frequency corresponding to a cut off frequency of the bias circuit the control electrode node of the first and second transistor is connected to ground configuring each of the first and second transistor as a common gate amplifier with respect to the signal formed on the sensor resistor.

In variant embodiments, each of the first and second transistor have their control electrode being selectively driven to apply a bias voltage by a respective first and second bias voltage through a respective first and second bias amplifier, connected at the other input to a terminal of the resistance.

In variant embodiments, the amplifying circuit arrangement includes a further current loop including an amplifier configured to compare a voltage on the load resistance to a reference voltage and adjust the value of the current issued by the current generator to regulate the current in the differential pair in the voltage bias mode.

In variant embodiments, the amplifying circuit arrangement includes a current loop configured to apply a current bias to the sensor resistor including a circuit arrangement to sum or respectively subtract a bias current to a current sunken by each of the current generators of the differential pair.

The solution refers also to a hard disk drive arrangement including a varying thermal resistor to perform the sensing and control of fly height of the tip in Hard Disk Drives, including a circuit as described above.

BRIEF DESCRIPTION OF THE DRAWINGS

Embodiments of the present disclosure will now be described with reference to the annexed drawings, which are provided purely by way of non-limiting example and in which:

FIG. 14 shows a single ended variant of the embodiment of FIG. 4;

FIG. 15 shows a single ended variant of the embodiment of FIG. 5;

DETAILED DESCRIPTION OF ILLUSTRATIVE EMBODIMENTS

Figure 1:
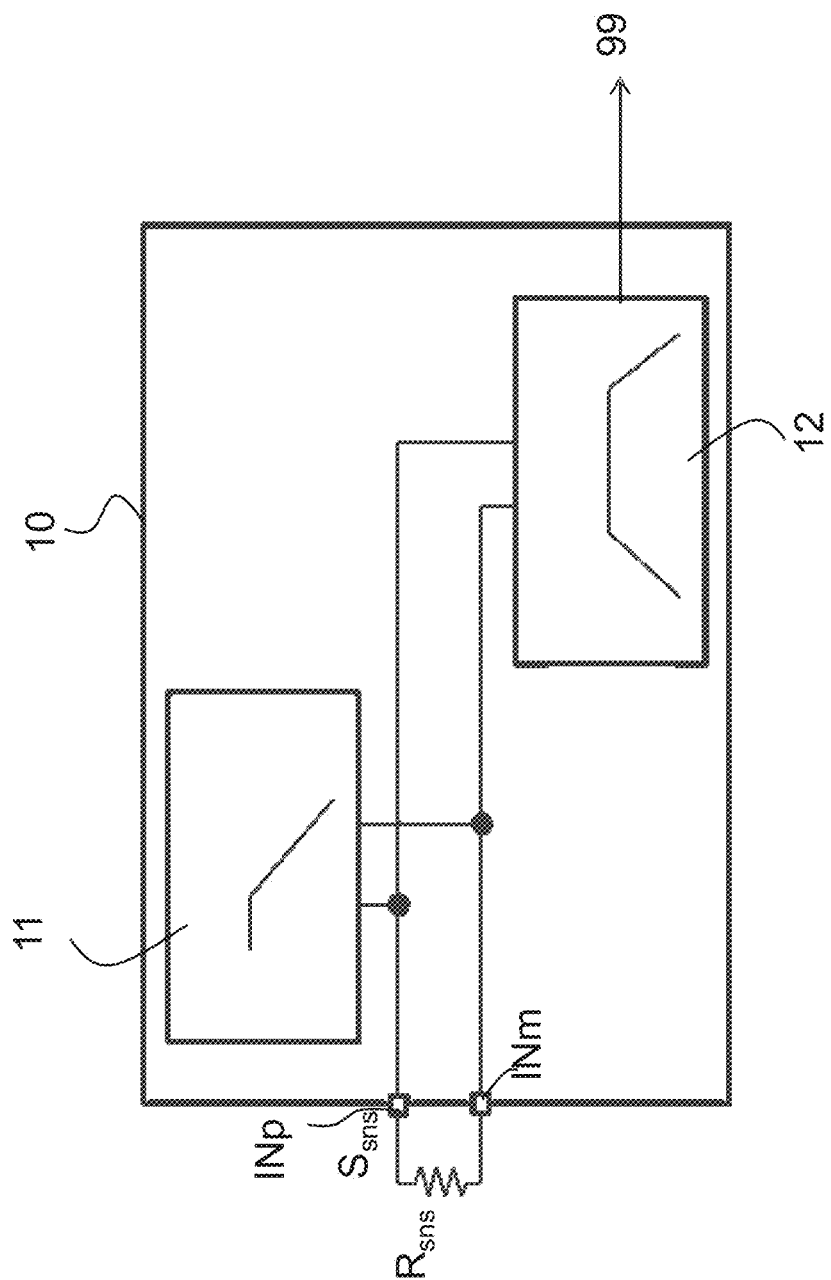
FIG. 1, 2 have been already described in the foregoing.

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Embodiments of the present disclosure relate to solutions concerning a circuit arrangement including a circuit for synthesizing a resistance having a value variation in time equivalent to the variation of a resistor to which are applied determined bias conditions.

The present disclosure in particular refers to use of the circuit in a gain recovery stage for low noise amplifier of the signal of a sensor resistor, in particular a thermal resistor, e.g. resistor varying its resistance value with the temperature, used in the sensing and control of fly height of the tip in Hard Disk Drives.

In brief the solution here disclosed solves the problem of a device which in general operates with a dependence from the value of a resistance, i.e. the sensor resistance, which varies in time, for instance with temperature and it is subject to known bias conditions, by providing a circuit arrangement including a circuit for synthesizing a resistance behavior equivalent to the behavior of the sensor resistance, e.g. a varying thermal resistor to which a resistance bias voltage and a resistance current bias are applied. Such circuit for synthesizing a resistor includes an amplifier, including an input transistor, having a high impedance output, such high impedance output being connected to the control node of a bias current generator of the input transistor generating a bias current flowing in the transistor, a further current generator issuing a current equal or proportional to the resistance bias current being connected to the high impedance output, the resistance bias voltage of the resistor being applied to the input of the amplifier, so that the transconductance of the transistor is equal or proportional to such sensor resistance.

In an embodiment the above resistance synthesizing circuit can be used to correct the dependence of gain in a low noise amplifier amplifying the signal formed on such sensor resistor, in particular for sensing and control of fly height of the tip in Hard Disk Drives.

Figure 2:
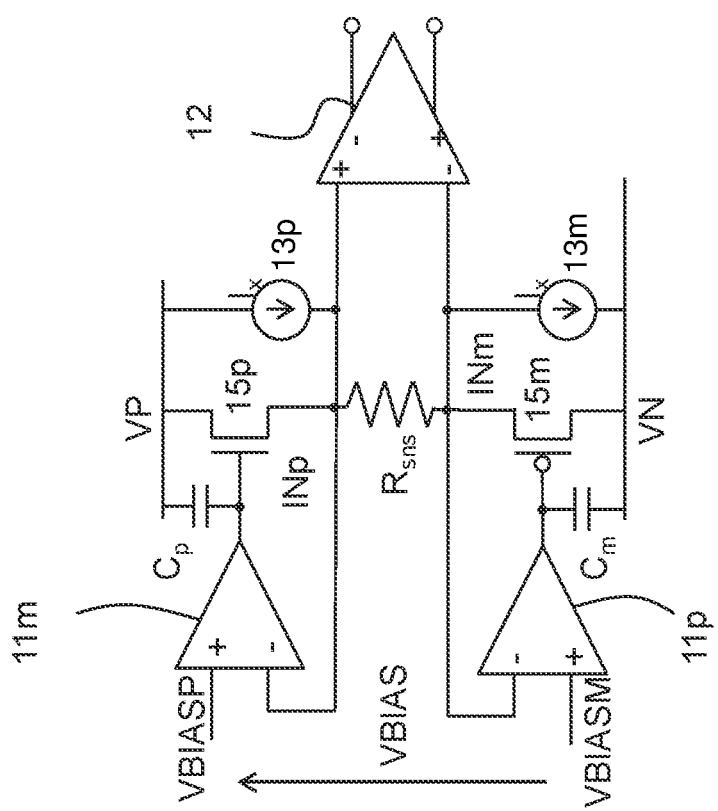
Figure 9:
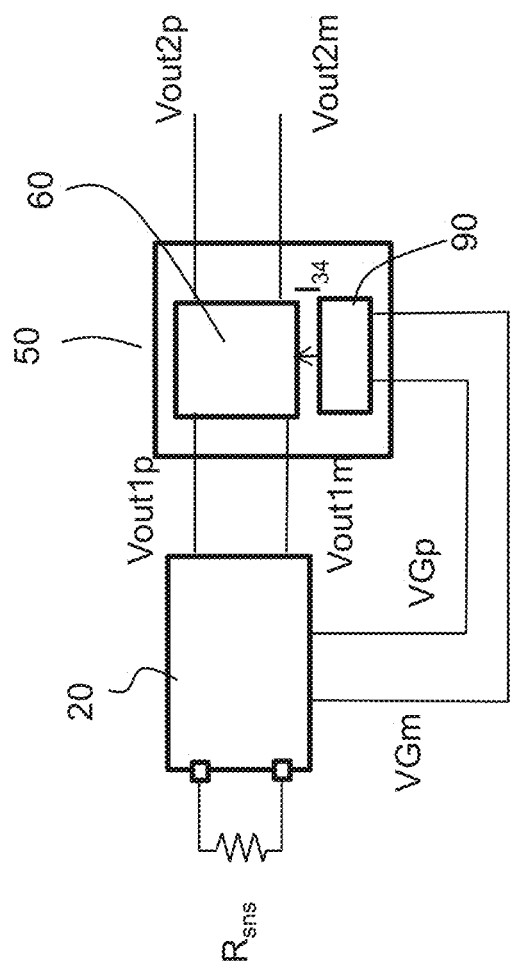
FIG. 9 shows a block diagram representing an arrangement of the circuit of FIG. 3 associated to a gain compensation stage.
Figure 10:
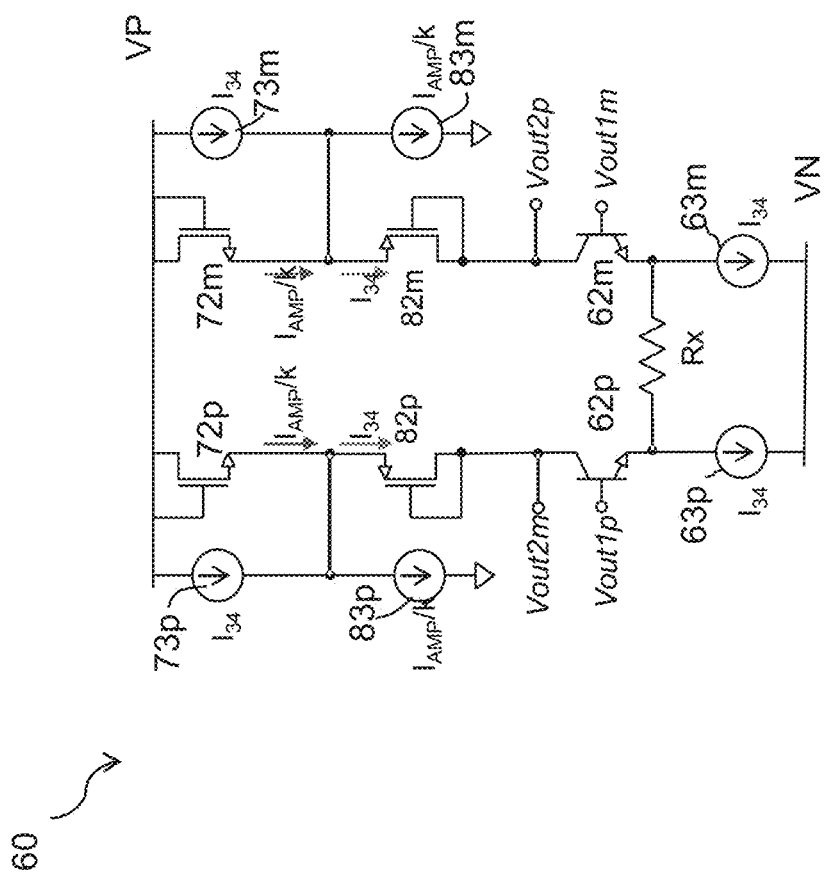
FIG. 10 shows an amplifying module of the gain compensation stage.

Under this view, in the following with reference to FIGS. 3 to 9 it will be described a circuit for low noise amplification which is novel over the circuit of FIGS. 1 and 2 and provides an application context, as indicated in FIG. 10, for the use of a circuit arrangement including a gain recovery stage including a circuit for synthesizing a resistance equivalent to the resistance of a resistor to which a resistance bias voltage and a resistance current bias are applied. In particular the circuit for low noise amplification described with reference to FIGS. 3-9 represents a stage configured to apply to a thermal resistor a resistance bias voltage and a resistance current bias, to which the recovery gain stage 50 and the circuit for synthesizing a resistance described in FIGS. 10-13 can be applied. However, the circuit for synthesizing a resistance, i.e. a sensor resistance estimation circuit, can be used separately from the such amplification stage of FIG. 2 or FIGS. 3-9, whenever an unknown resistance has to be estimated and synthesized in analog way starting from its bias conditions, i.e. the voltage applied to it and current flowing through it.

Figure 3:
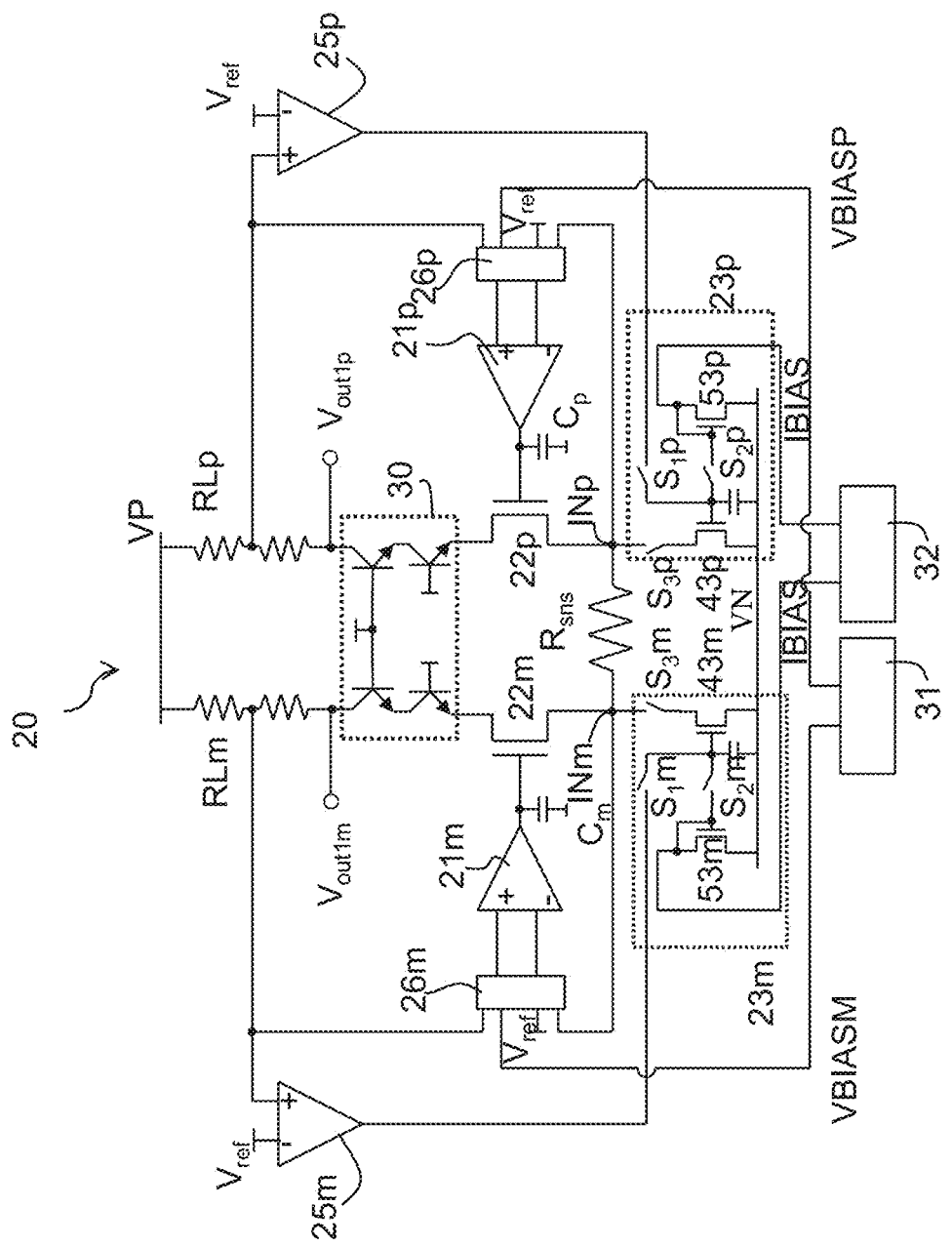
FIG. 3 shows an embodiment of the circuit here described.

Thus, in FIG. 3 it is shown a circuit for low noise amplification of a thermal varying resistance, indicated with the reference 20. Such circuit 20 may be a first differential input amplifying stage.

Circuit 20 includes a differential pair of transistors, specifically NMOS MOSFETS, 22m and 22p including a first MOSFET 22m and a second MOSFET 22p, connected between a positive supply voltage VP and a negative supply voltage VN, with respect to the common mode voltage of the sensor (from now on respectively only positive supply voltage and negative supply voltage). In the following, since the differential arrangement is symmetrical, component belonging to the first branch, conventionally the positive or plus, are indicated with a 'p' subscript and the other, conventionally the negative or minus, with a 'm' subscript. Also since the behavior and arrangement of a component of a branch and of the dual component on the other branch is the same, they will be indicated together, i.e. a MOSFETS 22m, 22p indicating that the explained function, arrangement or behavior applies also to the dual component.

The MOSFET pair 22p, 22m is arranged as a differential input pair of a differential amplifier. Each of the differential MOSFETs 22p, 22m is thus connected to the negative supply voltage VN through a respective current generator 23m, 23p providing the current bias of the differential pair. In the same way the drain electrodes of the differential MOSFET 22m, 22p are connected through respective load resistances RLm and RLp to the positive voltage VP. Respective output nodes Vout1m, Vout1p are taken on such drain electrodes of the differential MOSFET 22m, 22p. In the example of FIG. 3 between the drain electrodes of the differential MOSFET 22m, 22p and the differential output nodes Vout1m, Vout1p there is also arranged a cascode stage 30 to improve the performance of the amplifier circuit, i.e. the bandwidth. The cascode stage 30 might be used to perform the multiplexing between different hard disk heads.

The two terminals of the sensor resistor $R_{sns}$ are connected to the source electrodes of the differential MOSFET 22m, 22p.

The gate electrode of each differential MOSFET 22m, 22p is driven by a respective bias operational amplifier 21m, 21p and it is connected to ground through a cut-off capacitor $C_m$, $C_p$. The signals at the inputs of the bias operational amplifier 21m, 21p are selected through a respective multiplexer 26m, 26p.

Each differential load resistance RLm, RLp may be partitioned in half, as shown in FIG. 3 and in the partition point or node is taken one of the inputs of a current loop operational amplifier 25m, 25p. The other input of the current loop operational amplifier 25m, 25p is connected to a reference voltage $V_{ref}$.

Such current loop operational amplifier 25m, 25p has its output connected as control input of the current generator module 23m, 23p to regulate the current in the differential pair 22m, 22p in the voltage bias mode.

A voltage digital to analog converter 32 is provided, which supplies differential bias voltages VBIASM, VBIASP as an input of the respective multiplexers 26m, 26p.

A current digital to analog converter 31 is also provided, which supplies a bias current IBIAS as an input of the respective current generator module 23m, 23p.

The current generator 23m, 23p, as shown in FIG. 3, includes a current generating MOSFET 43m, 43p connected between the source of the differential MOSFET 22m, 22p and the negative supply voltage VN. The gate of this current generating MOSFET 43m, 43p is connected through switches $S_1$m, $S_1$p, $S_2$m, $S_2$p, either to the output of the current loop operational amplifier 25m, 25p, which in this case regulates the current sunk by the current generator MOSFET 43m, 43p or to the gate of a diode connected MOSFET 53m, 53p which receives the bias current IBIAS from the current DAC 32 on its input, i.e. its drain. Therefore the current generator MOSFET 43m, 43p forms with the diode connected transistor 53m, 53p a current mirror and the current generator MOSFET 43m, 43p sinks a current which is the difference between the fixed current IAmp of the current generating MOSFET 43m, 43p operating as bias current generator of the differential stage 22m, 22p, and the bias current IBIAS, $I_{AMP}$-IBIAS.

A third switch $S_3$m, $S_3$p is also provided to disconnect the current generating MOSFET 43m, 43p from the differential pair 22m, 22p. The switches $S_3$m, $S_3$p, as well as the cascade stage 30, can be used to multiplex the bias circuits between many different channels present into the device In the following the operation of the circuit will be discussed.

Figure 4:
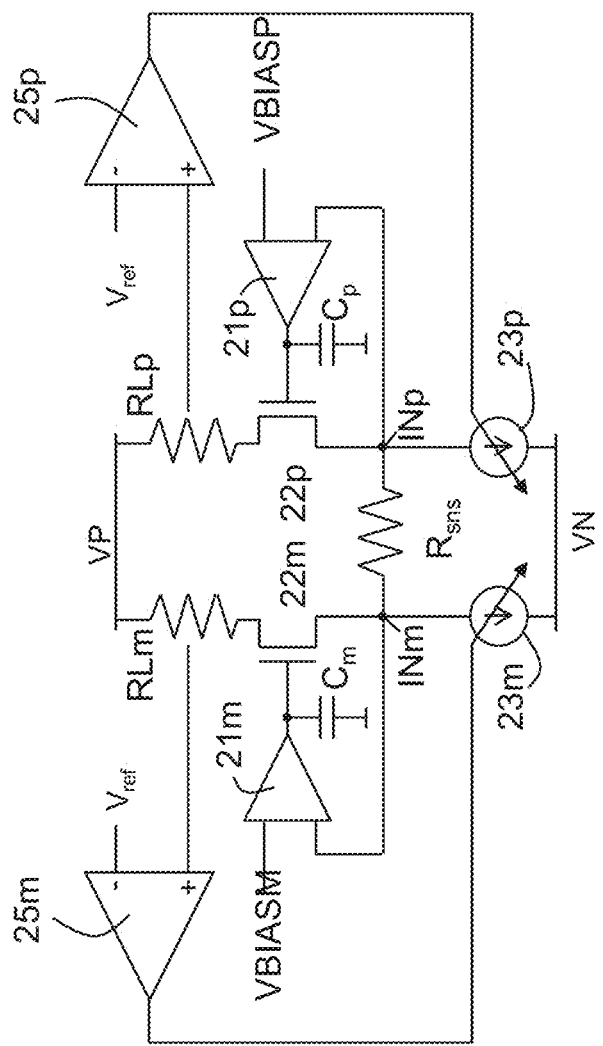
FIG. 4 shows the circuit of FIG. 3 in a first operation mode.

FIG. 4 shows a simplified representation of the circuit operating in voltage bias mode. The non-operating portions of the circuit are here not shown and also the multiplexer is replaced by a direct connection to the input selected in this mode. Also the cascode 30 is not shown for simplicity.

In voltage mode, under the control of a processor or logic module provided associated with the amplifier circuit or available in the circuit apparatus using the amplifier circuit, e.g. a hard disk controller, such module being not shown in the Figures, the second switch $S_2$m, $S_2$p is open, excluding the diode connected transistor 53m, 53p, and the first switch $S_1$m, $S_1$p is closed connecting the current loop operational amplifier 25m, 25p to the control input of the current generator module 23m, 23p. The multiplexer 26m, 26p is controlled to select the outputs of the voltage DAC 31 as input of the bias amplifier 21m, 21p, while the other input is connected to one of the terminals of the resistor $R_{sns}$. The voltage DAC 31 is internally creating two bias voltages, VBIASM and VBIASP, centered on a programmable common mode whose differential voltage can be programmable as well. Thus through the bias amplifier 21m, 21p is implemented a voltage loop to set a voltage across the sensor resistor Rsns. The voltage loop sets the voltage across the sensor resistor Rsns to be equal to the reference bias voltages VBIASM and VBIASP creating the desired bias condition.

Thus, it can be seen that, in order to have the differential pair 22m, 22p working balanced, a current loop is inserted, represented by the amplifier 25m, 25p with inputs connected to the reference voltage $V_{ref}$ and to the voltage drop on the load resistance RLm, RLp, controlling the current generator 23m, 23p. Such voltage and current loops are working nested with each other. The current flowing into the differential pair 22p, 22m (and thus into the load resistors RLp, RLm) is forced to be equal by such current loop. The current loop is comparing the voltage drop on the load resistor RLp, RLm with a reference voltage, $V_{ref}$, obtained by a reference current on an internal resistor.

It is noted that the two single ended operational amplifiers 21p, 21m driven by the bias voltages VBIASP and VBIASM can be substituted with a fully differential one. In the same way the two single ended operational amplifiers 25m, 25p driven by the reference voltage, $V_{ref}$, can be substituted with a fully differential one.

Figures 5, 6:
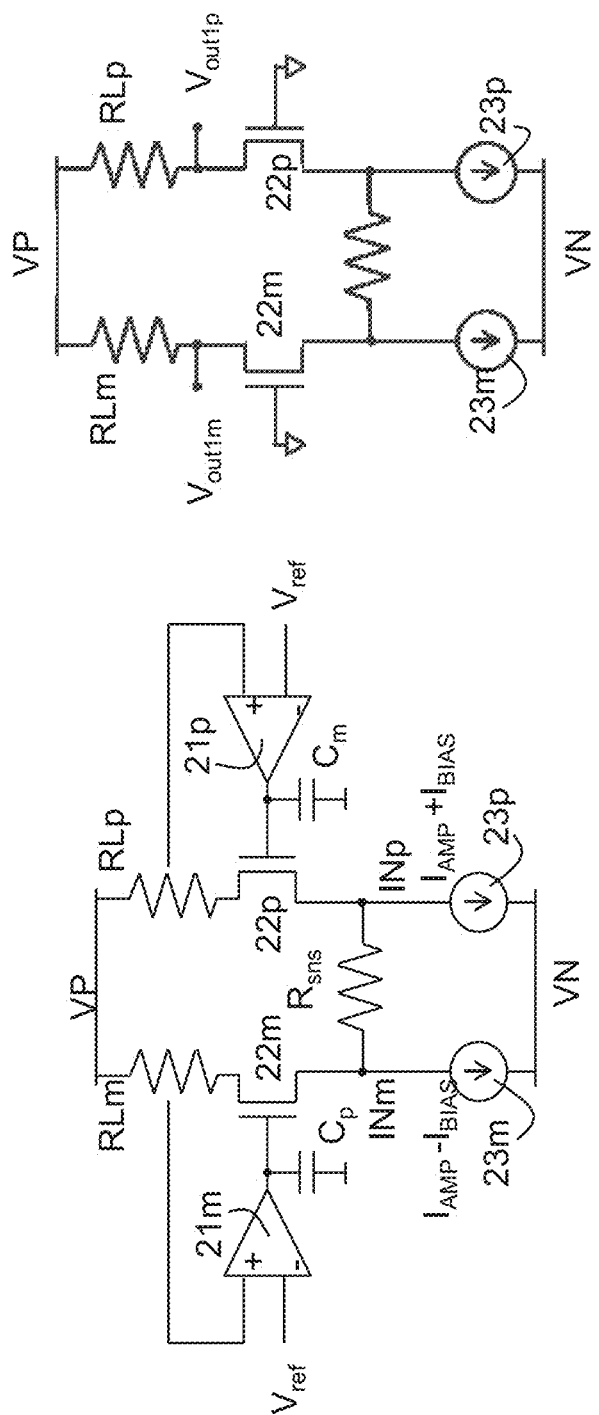
FIG. 5 shows the circuit of FIG. 3 in a second operation mode.
FIG. 6 shows the circuit of FIG. 3 in a third operation mode.

In current mode, the circuit 20 of FIG. 3 is rearranged by operating on the switches $S_1$p, $S_1$m, $S_2$p, $S_2$m and the multiplexers 26p, 26m to apply a constant current bias through the sensor $R_{sns}$, as shown in FIG. 5. In the simplified schematic of the circuit operating in current mode there shown the current DAC 31 creates a reference current, the bias current $I_{BIAS}$, that is summed or subtracted to a fixed current, the current $I_{AMP}$ and sunken by the two current generators 23m, 23p which provide the bias current of the differential stage. The differential voltage across the sensor resistor Rsns is controlled by the feedback voltage loop of the voltage bias amplifiers 21m, 21p. Such a loop works by forcing the current flowing into the load resistors RLm, RLp, and thus into the differential pair MOSFET 22p, 22m, to be equal to the fixed current $I_{AMP}$. By difference, the desired current is forced to flow into the sensor resistor Rsns.

Outside the bias bandwidth the circuit 20 of FIG. 3 operates in the same way both in voltage and current mode and the corresponding simplified circuit is shown in FIG. 6. The bias loop is emulating an AC coupling for the signal, cutting out the DC component, where the high pass low corner frequency corresponds to the GBWP (Gain-Bandwidth product) of the loop that is driving the differential MOSFET transistor pair 22m, 22p.

The control electrode nodes, i.e. the gate, of the differential pair transistors 22m, 22p are connected to ground through the cut-off capacitors $C_m, C_p$, which value is chosen so that they become short-circuit outside the bias loop bandwidth. At frequencies higher than the bandwidth of the bias loop thus the gates of differential MOSFET transistor pair 22m, 22p are kept fixed. Thus the signal at the sensor resistor Rsns is amplified by the stage working in common gate way.

As it can be understood from the FIGS. 3, 4, 5, 6 the amplifier circuit here described not necessarily must include both the circuitry to operate bias in voltage mode and in current mode, but can include only either the bias circuitry shown in FIG. 4 or in FIG. 5.

FIGS. 14 and 15 show variant embodiments of the circuit for low noise amplification 20, respectively operating in voltage mode (FIG. 14) and current mode (FIG. 15), implemented in a single ended configuration, instead of a differential circuit like in FIGS. 4 and 5.

As shown, the single ended configuration includes only one branch of the differential structure of FIG. 3, 4, 5, for instance the branch with the gate electrode of MOSFET 22m driven by the bias operational amplifier 21m and connected to ground through a cut-off capacitor $C_m$. The current loop, represented by the amplifier 25m, with input connected to the reference voltage $V_{ref}$ and to the voltage drop on the load resistance RLm controls the current generator 23m. The end of the sensor resistor Rsns not connected to the source of the MOS 22m is connected to a single end reference voltage Vx.

The circuit for low noise amplification 20 can also be modified to cut the current loop in voltage bias mode as shown in FIG. 4 or voltage loop in current bias mode as shown in FIG. 5, to create a DC coupling to the circuit. An offset compensation can be performed working on the voltage DAC settings in current mode and on the current DAC settings in voltage mode.

Figures 16, 17:
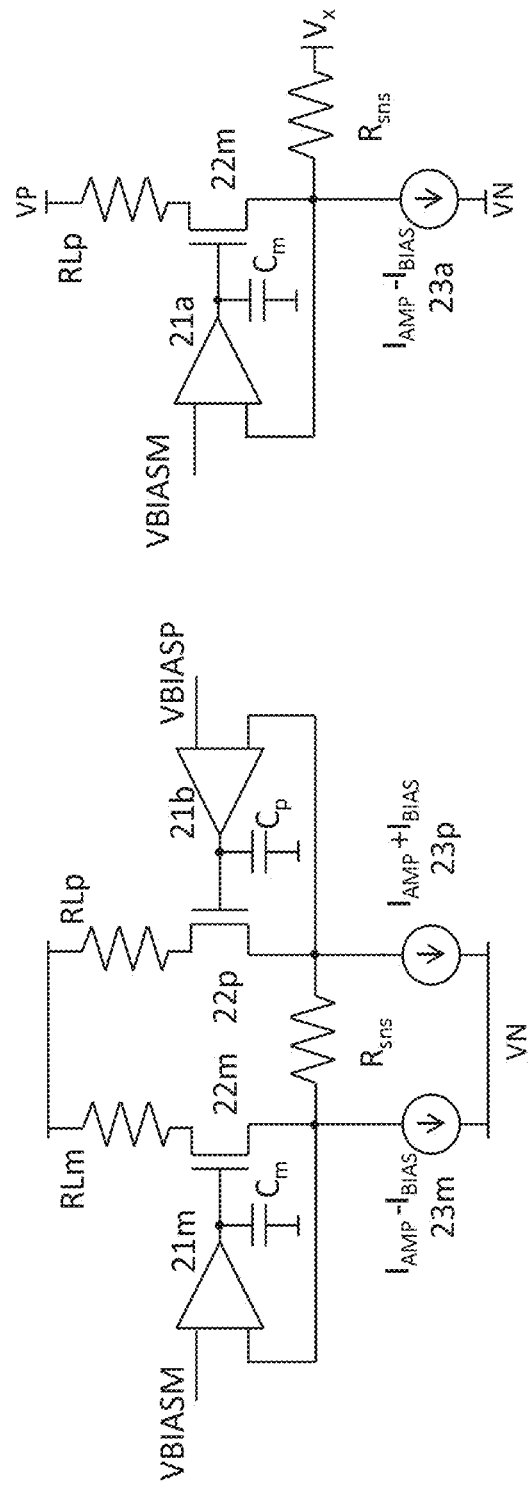
FIG. 16 shows a further variant of the embodiment of FIG. 4.
FIG. 17 shows a further variant single ended variant of the embodiment of FIG. 5.

FIG. 16 shows an embodiment of the differential circuit 20 in voltage mode with the DC coupling mode configuration. The voltage DAC 31, (not shown in FIGS. 16, 17, but connected as in FIG. 3, is set to apply (VBIASP-VBIASM) as the differential offset compensation.

FIG. 17 shows a corresponding single ended embodiment in voltage mode with the DC coupling mode configuration. VBIASP supplied by a corresponding voltage DAC is in this case the single-ended offset compensation.

Figure 7:
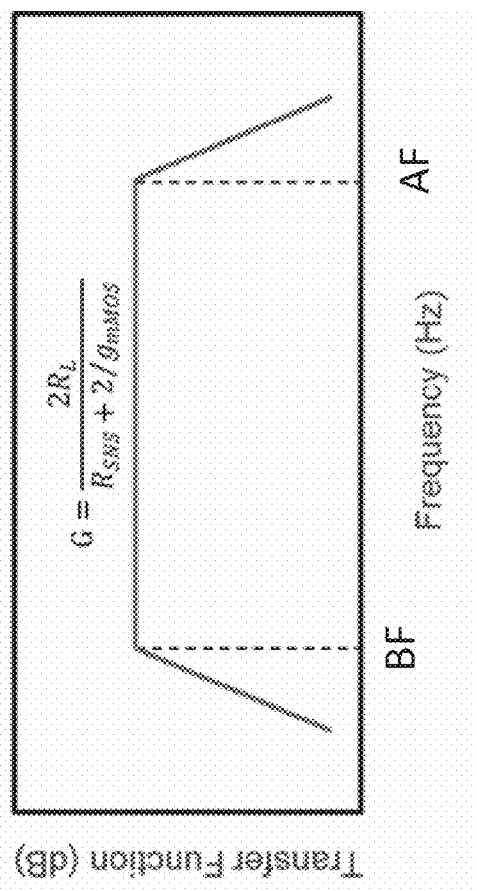
FIGS. 7 and 8 show diagrams representative of the transfer function and of the noise in the circuit described as a function of frequency.

FIG. 7 shows the transfer function of the circuit of FIG. 3, as function of frequency. With BF is indicated the cut-off frequency of the bias loop of FIGS. 4 and 5, which corresponds to the low high-pass frequency of the amplifier, with AF the cut-off frequency, i.e. the low-pass frequency, of the amplifier of FIG. 6.

Indicating with gm the transconductance of each of the MOSFETs 22m and 22p of the differential pair, the input impedance seen from the sensor resistor Rsns is 2/gm:

middle frequency voltage signal is transformed into a current and then it creates an output differential voltage with the following gain:

$$G = \frac{2R_L}{R_{SNS} + 2/g_{mMOS}}$$

where $R_L$ is the load resistance on each branch m and p ($R_L$=RLm=RLp).

Using the topology of the circuit 20 of FIG. 3 it is possible to save from at least one big and noisy component: in fact the differential pair transistors 22m,22p is used both for bias and amplification. Thus, there is no need to have a couple of big MOS transistor to perform the bias function and a big differential pair to amplify the signal. This has good impact in terms of area occupation.

For what concerns the noise, the equivalent noise referred to the input in the signal bandwidth can be expressed as:

$$V_{neq}^2 = i_{genP}^2 \frac{R_{sns}^2}{4} + i_{genM}^2 \frac{R_{sns}^2}{4} + i_x^2 \frac{1}{g_{min}^2}$$

where $i_{genP}^2$ and $i_{genM}^2$ indicate the current noise of the two tail current generators 23m, 23p, while q indicates the current noise of the differential pair transistors 22p and 22m.

Figure 8:
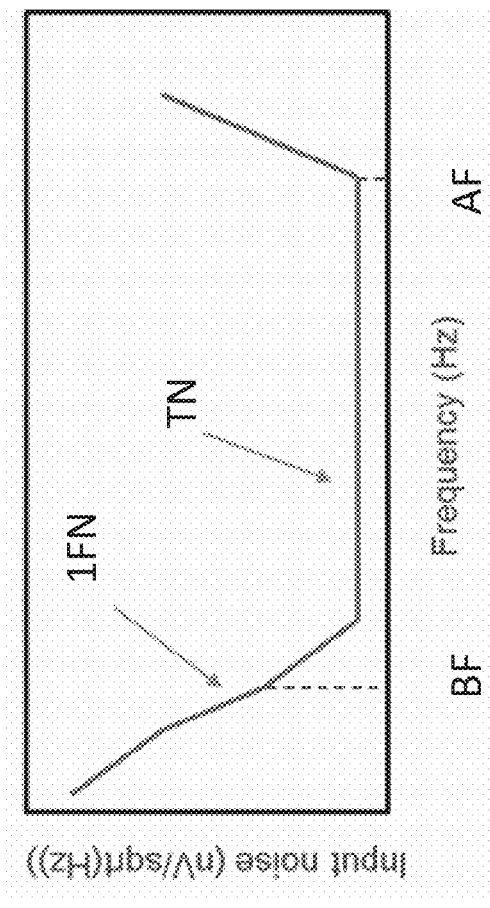

FIG. 8 shows the input noise as function of the frequency. Below the bias cut-off frequency the noise is 1/f noise 1FN, while in signal bandwidth is thermal noise TN with the constant value indicated above.

As just described the circuit 20 used as first stage to bias and amplify the signal can be simplified, in the signal bandwidth, as a common gate differential stage, as shown in FIG. 6: its gain is dependent from the sensor resistance ($R_{sns}$) and the transconductance of the differential pair ($g_m$). Indicating with $V_{out1d}$ the differential voltage at the output between $V_{out1p}$ and $V_{out1m}$ nodes and with $V_{snsd}$ the differential voltage over the sensor resistor Rsns, i.e. the sensor signal $S_{sns}$, the gain G1 of the first stage 20 is:

$$G_1 = \frac{V_{out1d}}{V_{snsd}} = \frac{2R_L}{R_{SNS} + 2/g_{mMOS}}$$

As mentioned, gain variation can be significant according to the sensor process variability and application. Also the transconductance $g_m$ of the input stage 20 (i.e. the bias output stage) could vary over process and temperature. This leads to the need to compensate the gain variability to obtain a flat gain over the values of sensor resistance and process and temperature.

Therefore it is provided a second gain stage, indicated with 50 in FIG. 9, after the first stage 20, whose gain compensates the variations with respect to sensor resistance and MOS process corners.

The gain of the second stage 50 is designed to be:

$$G_2 = \frac{V_{out2d}}{V_{out1d}} = \frac{k(R_{SNS} + 2/g_{mMOS})}{R_X}$$

where k is a scaling factor and Rx a reference resistor.

In this way the cascade of the two stages has a transfer function with gain:

$$G = G_1 \cdot G_2 = \frac{V_{out2d}}{V_{snsd}} = \frac{k \cdot 2R_L}{R_X}$$

The resulting gain is independent from sensor resistance, MOS process corner, and if the reference resistor Rx is of the same type of the load resistance $R_L$ also from resistor process corner and temperature. Of course by operating on the scaling factor k, which, as shown in the following depends on the dimensions, namely the channel dimensions, of the MOS transistors used for the second stage 50, the resulting gain G can be changed.

FIG. 9 schematically shows the stage 20, which, as shown, in the amplification bandwidth, is a common gate differential input stage associated to the gain G1 as discussed above. The differential output $V_{out1p}$, $V_{out1m}$ is supplied as input to the second stage 50, which includes an amplifying stage 60, associated to the second gain G2 indicated above. The amplifying stage 60 in order to have a transconductance depending on the value of resistance of the thermal resistor $R_{sns}$, includes a equivalent resistance synthesizing circuit 90, which receives from the first stage 20 the gate voltages VGp and VGm formed at the gate electrodes of the input differential pair of transistors, 22p, 22m, and it receives also the sensor current sensed from the first stage amplifier. Such equivalent resistance synthesizing circuit 90 on the basis of such input issues a calibrated signal, e.g. a current, $I_{34}$, which is supplied to the amplifying stage 60 to synthesize the required value of resistance, as better detailed in the following.

Even if the field of application of this solution is in the preamp device in the data storage market, the solution could be applied in fields where it is needed to bias an external sensor element and elaborate its generated signal.

FIG. 10 shows the gain recovery stage 50 here described.

The differential outputs $V_{out1p}$ and $V_{out1m}$ of the first differential input stage 20 of FIG. 3 are brought as the input of a second amplifying stage 60 in the gain recovery stage 50 including a differential pair of transistors 62p, 62m, in this case a bipolar transistor pair, although MOS transistors can be used as well. The emitters of the differential bipolar transistors 62m, 62p are connected to the terminals of a reference resistor RX. The differential stage 60 includes current generators 63m, 63p connected between the emitters and the negative supply VEE, sinking the calibrated current $I_{34}$. On the collector electrodes of the differential pair 62p, 62m is taken the differential output $V_{out2p}$, $V_{out2m}$ of the amplifying stage 60, i.e. the gain recovery stage 50. The differential amplifying stage 60 then includes as load of the differential pair 62p, 62m, a NMOS transistor 72p,72m which drain and gate electrode are connected together, i.e. diode connected, and connected to the positive supply Vcc. Such NMOS 72p, 72m is designed with scaled dimensions, by the scaling factor k so that, with respect to the differential pair 22p, 22m of the first differential stage having a transconductance gm, the NMOS 72p,72m has a transconductance gm/k.

Between the NMOS 72p, 72m and the collector of the differential transistors 62, 62p is placed a resistance synthesizing transistor 82p,82m, in particular a pMOS transistor, also diode-connected and having its drain connected to the differential output $V_{out2p}$, $V_{out2m}$, while its source is connected to the drain of the scaling NMOS 72p,72m. This resistance synthesizing transistor 82p, 82m has dimensions corresponding to the NMOS transistors of a differential pair 92m, 92p of resistance synthesizing circuit 90 described in the following and sinks the calibrated current $I_{34}$, which value is determined by the equivalent resistance synthesizing circuit 90, better detailed in the following, so that the transconductance of the resistance synthesizing transistor 82p,82m is $kR_{sns}/2$.

Finally a tail current generator 73p, 73m connected between the positive voltage supply Vcc and the NMOS drain also draws the calibrated current $I_{34}$, while a current generator 83p, 83n, connected between the NMOS drain and the ground draws a current IAMP/k, i.e. the fixed bias current of the tail generators of the input stage 20, divided by the scaling factor k.

Then, the second stage 60 operates as follows.

The output of the first stage 20 is used as input of the differential pair 62p, 62m. The load of the differential pair 62p, 62m is made by two different parts:

a scaling nMOS 72p,72m which designed as scaled replica, by a scaling factor k, of the MOS transistor 22p,22m in the first stage 20. Such scaling NMOS 72p, 72m is biased with the same, scaled, current of the pair 22p, 22m in the first stage 20, i.e. the fixed current IAMP, in order to obtain a transconductance equal to $g_m/k$; and a resistance synthesizing transistor, a pMOS transistor in the example shown, 82p, 82m biased with a calibrated current $I_{34}$ in order to be able to synthesize the resistance of sensor resistor $R_{sns}$, i.e. determining an equivalent resistance $kR_{sns}/2$ for each of the pMOS. It is underlined that also an nMOS could be used instead of a pMOS; in this case the circuit devoted to synthesize the sensor resistance has to be reverted.

With this arrangement the stage gain G2 of the second stage 50 is:

$$G_2 = \frac{k(R_{SNS} + 2/g_{mMOS})}{R_X}$$

that is the desired function.

Since the sensor resistance $R_{sns}$ is unknown, the problem is shifted to the generation of the calibrated current $I_{34}$ in order to have the desired equivalent resistance in the resistance synthesizing transistor 82p,82m. Using the information coming from the first stage 20 it is possible to generate such a current in a complete analog way with very good precision.

The sensor resistance $R_{sns}$ value is generally unknown but it can be inferred from the biasing conditions. The differential voltage applied to the sensor, i.e. the bias voltage $V_{BIAS}$, can be derived from the voltage at the gates of the MOS 22p, 22m in the first stage, $V_{GP}$ and $V_{GM}$, while the current flowing through it, $I_{BIAS}$ can be obtained from difference of the tail current generators 23m, 23p in the first stage as well.

$$R_{SNS} = \frac{V_{BIAS}}{I_{BIAS}} = \frac{V_{BIASP} - V_{BIASM}}{I_{BIAS}} = \frac{V_{GP} - V_{GM}}{I_{BIAS}}$$

Figure 11:
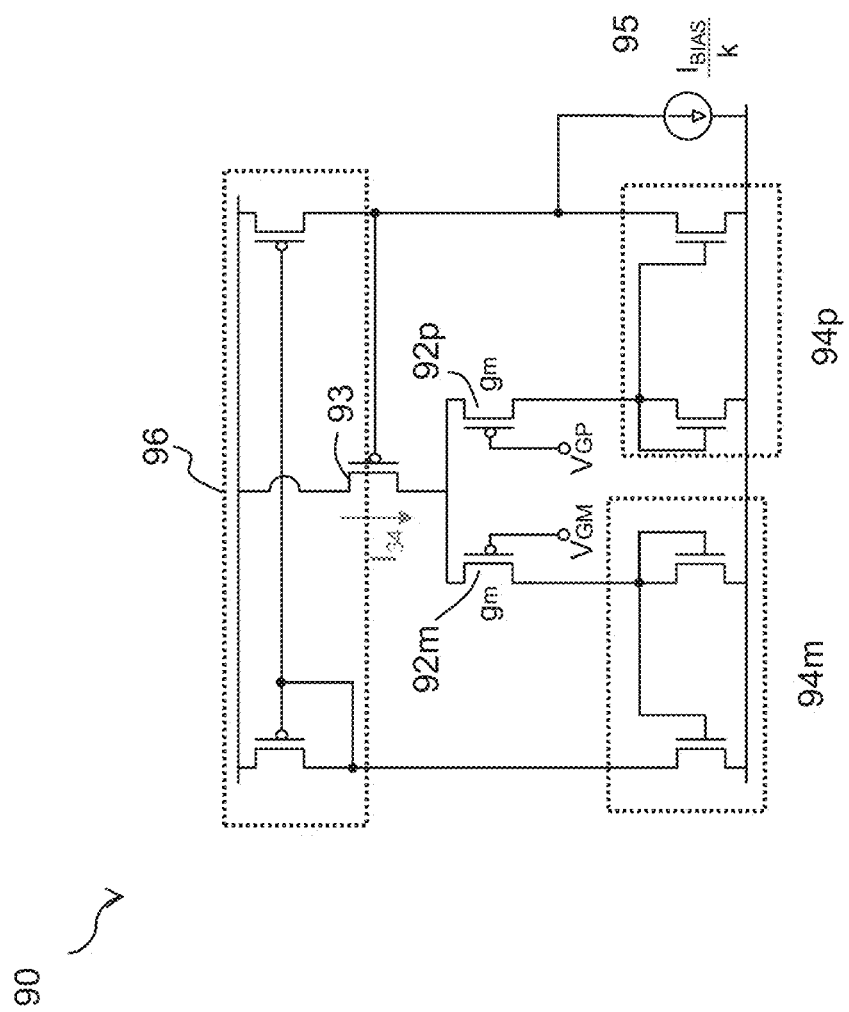
FIG. 11 shows a resistance synthesizing module of the gain compensation stage.

The circuit 90 able to synthesize such an equivalent resistance is shown in FIG. 11. The circuit 90 substantially is based on an architecture of a balanced operational amplifier.

A differential pair of pMOS 92m, 92p receives as input the gate voltages VGP, VGM of the first stage 20. A tail current generator 93 of the differential pair 92m,92p, is obtained by a PMOS connected to the positive supply voltage Vcc.

The load of the differential pair 92m, 92p is formed by respective current mirrors 94m and 94p formed by NMOS with the sources connected to the negative supply VEE. Their diode connected transistor is connected as load on each respective differential branch, while each other transistor of the mirrors 94m, 94p is connected to the transistor of another current mirror 96, using PMOS transistors and connected to the positive supply Vcc. This type of arrangement allows to take a high impedance high swing voltage on the drain node of the not diode connected transistor of current mirror 96. In this case, in addition an offset current generator 95 supplying a current $I_{BIAS}/k$ is connected between the negative supply VEE and the input node of the tail generator 93, which are both connected to such high impedance output.

Thus, in the circuit 90 of FIG. 11 it is used an operational amplifier with a high impedance output (mirror 94p) closed in loop on the tail current generator 93 of the differential pair 92m,92p. Applying a voltage offset $V_{OS}$, i.e. VGM-VGP, at the input and a current offset $I_{OS}$, which is in this case represented by the offset current generator 95 with current $I_{BIAS}/k$, at the output of the differential stage 92m, 92p, such loop acts in order to balance these offsets and drives the gate of the current generator 93 to have a transconductance of the input differential pair equal to:

$$g_m = \frac{I_{OS}}{V_{OS}}$$

Using $(V_{GP}-V_{GM})$ as $V_{OS}$ and $I_{BIAS}/k$ as $I_{OS}$, the transconductance gm is:

$$g_m = \frac{I_{BIAS}/k}{V_{BIAS}} = \frac{1}{kR_{SNS}}$$

Therefore the current of generator 93 can be taken as the calibrated current $I_{34}$ and can be mirrored and fed to pMOS 82m, 82p in the amplification stage. If they have the same dimensions of the pair 92m, 92p, their transconductance gm is the same and it is possible to synthesize the desired unknown resistance and use it as load of the amplification portion 62p, 62m of the second stage 50.

Figure 12:
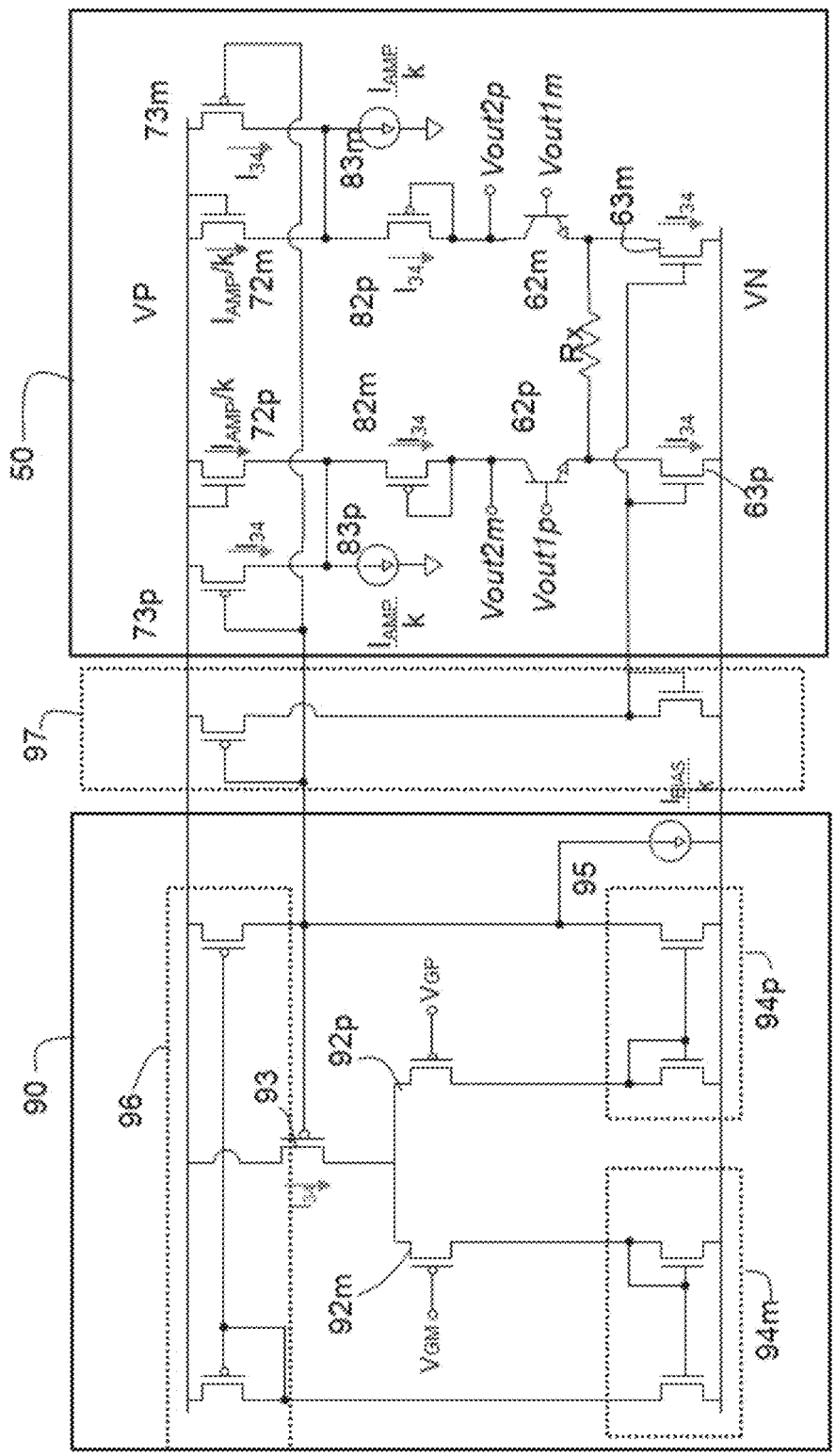
FIG. 12 shows the complete circuit of the gain compensation stage.

In FIG. 12, the amplification portion 60 is shown together with the sensor resistance synthetizing circuit 90. To have the proper currents flowing in the pMOS 82m, 82p, the calibrated current $I_{34}$, flowing in the MOS 93, is sunk from the bottom, i.e. generators 63m, 63p and sourced from the top, i.e. generators 73p, 73m; in the meantime a generator of value $I_{AMP}/k$, 83p, 83m sinks to bias the NMOS transistor 72p,72m.

As shown in FIG. 12 the generators 73p, 73m are obtained by forming a current mirror with the current generator 93 of circuit 90.

Also the generators 63p, 63m are connected by their gates to a diode connected transistor to form current mirrors. The diode connected transistor is connected, though a further transistor, to the current generator 93, receiving as input the calibrated current $I_{34}$ which is then copied as the current of the tail generators 63p, 63m biasing the bipolar pair 62p, 62m.

As mentioned, the second stage 60 is here described in conjunction with a circuit designed to compensate the process and sensor variations in the transfer function of the elaboration chain of the fly height sensor in HDD application: these variations have influence on the gain that is supposed to be flat with respect sensor resistance and process corners. In the given application the second stage 60 is used in conjunction with a first stage working as a common gate stage, however the a circuit like the one described with reference to FIGS. 10-12 can be used in general whenever it is needed to estimate a resistance and create a gain proportional to this resistance.

Figure 18:
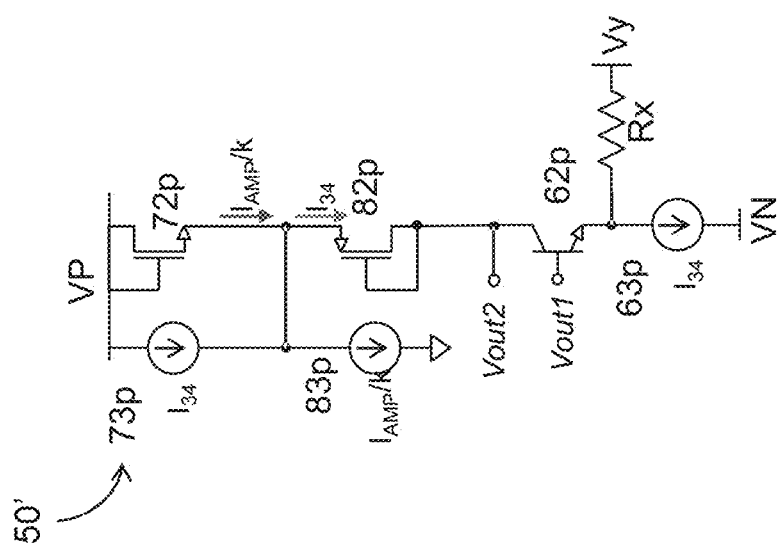
FIG. 18 shows a single ended variant of the circuit of FIG. 10.

In the same way as shown in FIGS. 14, 15 for the circuit for low noise amplification 20, the gain recovery stage 50 of FIG. 10 can be halved using only one branch in order to have a single ended structure, as shown in FIG. 18, where the single ended variant is indicated by the reference 50'. The reference resistor Rx is connected to a further reference voltage Vy.

Figure 19:
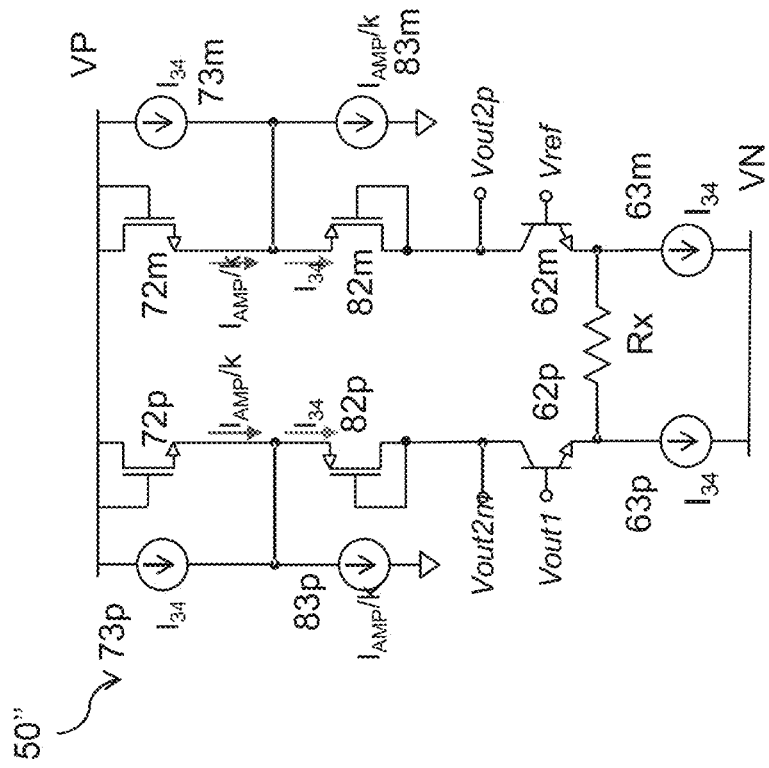
FIG. 19 shows a further single ended variant of the circuit of FIG. 10.

Another way to use the circuit of FIG. 10 in a single ended way, shown in FIG. 19, provides connecting one of the two inputs of the circuit 50 of FIG. 10, there represented by the differential outputs $V_{out1p}$ and $V_{outm}$, to a respective reference voltage $V_{ref2}$. The single ended circuit 50" is, apart from this, substantially identical to circuit 50 of FIG. 10. The output of the single ended gain recovery stage 50" in FIG. 19 can then be taken single ended or differentially.

Figure 20:
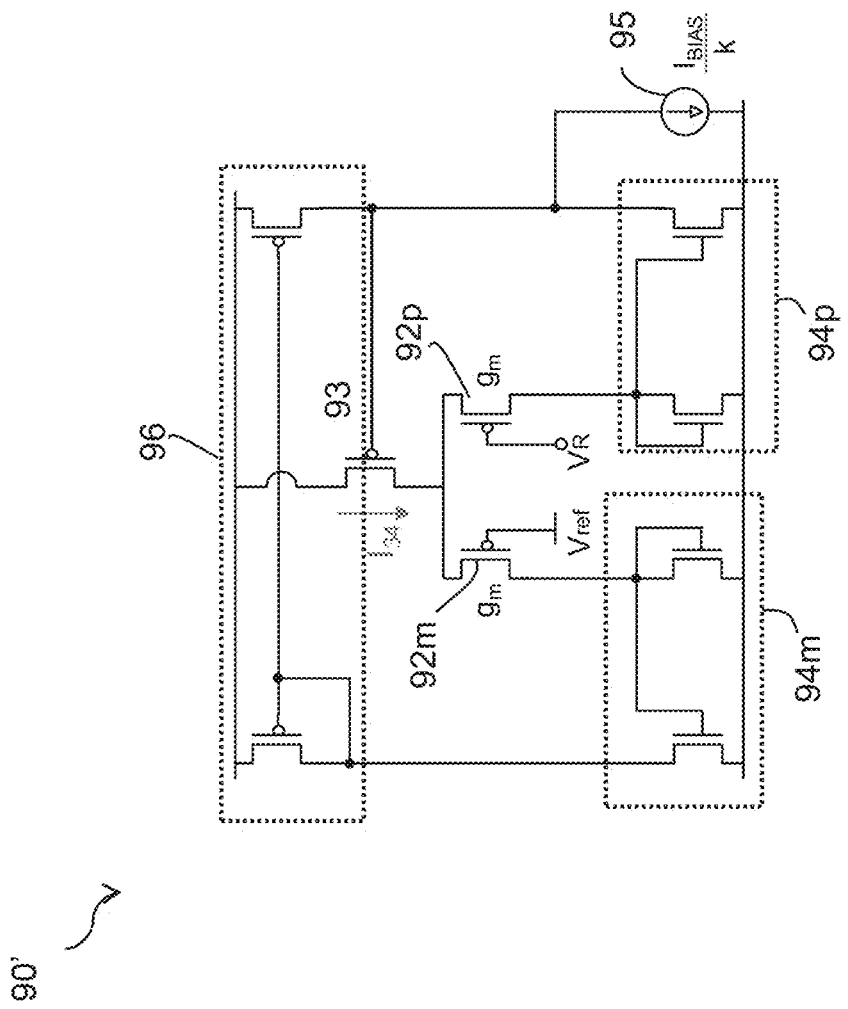
FIG. 20 shows a single ended variant of the circuit of FIG. 11.

FIG. 20 shows a variant embodiment of the resistance synthesizing circuit be arranged in a single ended structure. The circuit arrangement is the same of FIG. 11, however one of the two gates of the input pair 92m 92p, 92m in FIG. 20 is connected to a reference voltage $V_{ref3}$, while the other gate is connected to the bias voltage applied to the resistor to be synthesized, indicated with VR. Such bias voltage VR may correspond, by way of non-limiting example, to the gate voltage of transistor 22M. In this case reference voltage $V_{ref3}$ is obtained from voltage Vx, adding a gate source voltage VGS of the transistor 22n. In general, reference voltage $V_{ref2}$ has to be a reference voltage with the same polarization of output voltage VOUT1. With the circuit shown it can be derived from the reference voltage $V_{ref}$ in the first amplifying stage 20 shown in FIG. 5.

Figure 13:
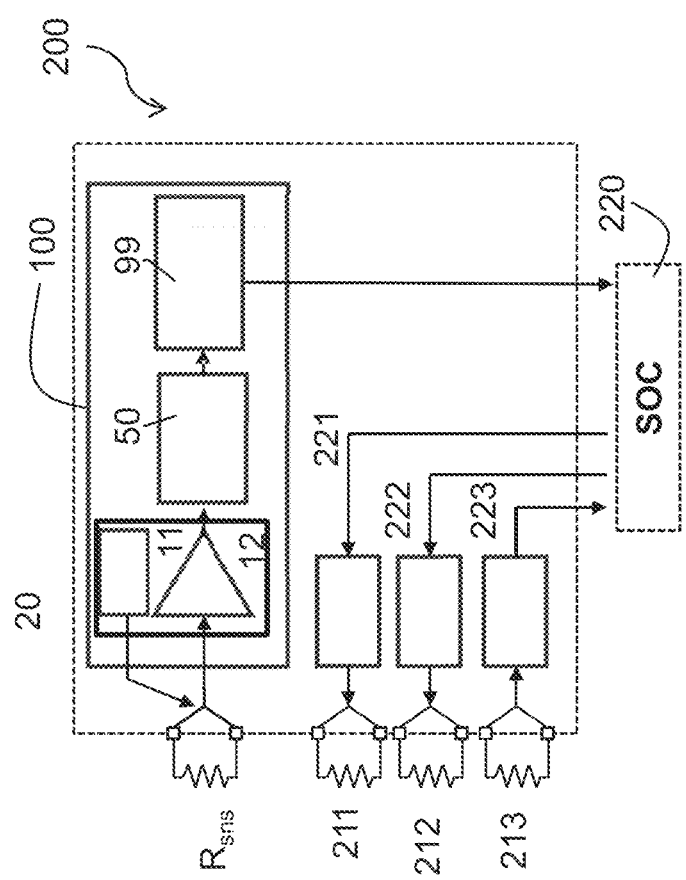
FIG. 13 shows schematically a hard disk drive arrangement using the circuit here described.

FIG. 13 shows a hard disk drive arrangement including a height tip sensor using the stages 20 and 50, indicated with 100. The sensor arrangement 100 includes the sensor resistor $R_{sns}$, which is connected to the circuit 20 performing both the bias function 12 and the amplification 11. Then the gain compensation 50 is provided, and the compensated signal is supplied to a processing stage 99, which in its turn provides the sensor measurement to a chip 220, e.g. an integrated circuit with a processor, in particular a System on Chip, which performs the control of the hard disk drive (not shown). Also are indicated a write tip 211, controlled by a writer module 221, a heater resistance 212, controlled by a heater module 222, and a magnetoresistance 213 controlled by a reader module 223, all these modules, including the sensor tip circuit 100 forming a preamplifier operating under the control of the disk controller in the chip 220.

The solution can be implemented both for single ended or differential stages. It can be adapted also for circuits using pMOS or bipolars instead of nMOS as first stage input pair: the same kind of component used in the first amplifier should be used as load in the gain recovery. In the same way it is possible to use a nMOS input pair instead of a pMOS input pair for the sensor resistance estimation circuit: in this case the load of the gain recovery will be constituted by two nMOS instead of pMOS.

Moreover, the sensor resistance estimation circuit can be used separately from the given amplification stage whenever an unknown resistance has to be estimated and synthesized in analog way starting from its bias conditions (voltage applied to it and current flowing through it).

The solutions disclosed herein have thus significant advantages with respect to the known solutions.

Of course, without prejudice to the principle of the invention, the details of construction and the embodiments may vary widely with respect to what has been described and illustrated herein purely by way of example, without thereby departing from the scope of the present invention, as defined by the ensuing claims.

Of course, with resistor is intended a device or a circuit, discrete or distributed, behaving like a resistor, in particular like a resistor which resistance varies according to one or more parameters, in particular according to a temperature variation in time.

What is claimed is:

1. A circuit arrangement, comprising
   a circuit configured to synthesize a resistor having a resistance value having a variation in time equivalent to a resistance variation of a sensor resistor applied with a resistance bias voltage and a resistance current bias, wherein the circuit comprises:
   an amplifier comprising an input transistor;
   a bias current generator comprising a control node coupled to an output of the input transistor, wherein the bias current generator is configured to generate a bias current flowing in the input transistor; and
   a further current generator configured to generate a current at least proportional to the resistance bias current and coupled to the output of the input transistor, wherein the resistance bias voltage is applied to an input of the amplifier, and wherein a transconductance of the input transistor is at least proportional to the resistance of the sensor resistor.

2. The circuit arrangement according to claim 1, wherein the current generated by the further current generator is equal to the resistance bias current.

3. The circuit arrangement according to claim 1, wherein the transconductance of the input transistor is equal to the resistance of the sensor resistor.

4. The circuit arrangement according to claim 1, wherein the amplifier is a differential amplifier.

5. The circuit arrangement according to claim 4, wherein the input transistor comprises an input differential pair of transistors, wherein an output of the differential amplifier is coupled to the control node of the bias current generator of the input differential pair of transistors, and wherein the bias current flows in the differential pair of transistors.

6. The circuit arrangement according to claim 5, wherein the resistance bias voltage applied to the sensor resistor is applied to inputs of the differential amplifier.

7. An amplifying circuit arrangement, comprising:
   a synthesizing circuit configured to synthesize a resistor having a resistance value having a variation in time equivalent to a resistance variation of a sensor resistor applied with a resistance bias voltage and a resistance current bias, wherein the synthesizing circuit comprises:
   an amplifier comprising an input transistor;
   a bias current generator comprising a control node coupled to an output of the input transistor, wherein the bias current generator is configured to generate a bias current flowing in the input transistor; and
   a further current generator configured to generate a current at least proportional to the resistance bias current and coupled to the output of the input transistor, wherein the resistance bias voltage is applied to an input of the amplifier, and wherein a transconductance of the input transistor is at least proportional to the resistance of the sensor resistor;
   a first amplifier stage configured to amplify a signal formed on the sensor resistor;
   a gain recovery stage comprising a second amplifying stage comprising at least one transistor having an input electrode coupled to an output of the first amplifier stage, wherein a load electrode of the at least one transistor is connected to a respective load circuit, the respective load circuit comprising:
   a NMOS transistor having scaled dimensions by a given scaling factor with respect to dimensions of at least one amplifying transistor of the first amplifier stage and biased with a scaled current, the scaled current being scaled by the scaling factor with respect to a bias current of the at least one amplifying transistor of the first amplifier stage;
   a circuit module comprising a resistance synthesizing transistor having same dimensions as the input transistor, wherein the circuit module is configured to sink a calibrated current to determine a transconductance value proportional to an inverse of a resistance of the sensor resistor, the calibrated current corresponding to a bias current flowing in the input transistor of the synthesizing circuit, and wherein other electrodes of the at least one transistor of the gain recovery stage are connected to a reference resistor.

8. The amplifying circuit arrangement according to claim 7, wherein the first amplifier stage comprises a first differential amplifier stage comprising a first differential pair of transistors configured to amplify the signal formed on the sensor resistor.

9. The amplifying circuit arrangement according to claim 8, wherein the gain recovery stage comprises a second differential amplifying stage comprising a second differential pair of transistors having input electrodes coupled to differential outputs of the first differential pair of transistors, the load electrode of the first differential pair of transistors is connected to the respective load circuit.

10. The amplifying circuit arrangement according to claim 9, wherein the NMOS transistor has scaled dimensions with respect to dimensions of the first differential pair of transistors.

11. The amplifying circuit arrangement according to claim 9, wherein the resistance synthesizing transistor has the same dimensions of a transistor of the first differential pair of transistors.

12. The amplifying circuit arrangement according to claim 9, wherein the calibrated current corresponds to the bias current flowing in the first differential pair of transistors.

13. The amplifying circuit arrangement of claim 8, wherein the first differential amplifier stage is configured as a common gate amplifier, and wherein the resistance synthesizing circuit is configured to receive at least a gate voltage of the first differential pair of transistors and is configured to output the calibrated current.

14. The amplifying circuit arrangement of claim 8, further comprising a current generator connected between a positive voltage supply and the NMOS transistor, wherein the further current generator is connected between the NMOS transistor and a reference potential emitting a current corresponding to a fixed bias current of the first differential pair of transistors divided by the scaling factor.

15. The amplifying circuit arrangement of claim 8, wherein the first amplifier stage comprises:
   the sensor resistor;
   a low noise amplifier circuit coupled to the sensor resistor to amplify the signal formed on the sensor resistor, the low noise amplifier circuit comprising a bias circuit portion configured to apply a bias voltage or a bias current to the sensor resistor, the bias circuit comprising a first transistor and a second transistor, each of the first transistor and the second transistor having a control electrode being driven by a respective first and second bias voltage, and connected respectively to each of the terminals of the sensor resistor to apply a differential bias voltage;
   an amplifying circuit portion of the signal formed on the sensor resistor;
   the first and second transistor being connected to form a differential pair of a differential amplifier having one electrode connected to a supply voltage through a respective load resistor and the other electrode connected to a respective terminal of the sensor resistor and to a respective current generator an output differential signal being collected on the electrodes connected to the load resistances;
   a respective low pass filtering component connected to the input electrode so that over a determined frequency corresponding to a cut off frequency of the bias circuit the control electrode node of the first and second transistor is connected to ground configuring each of the first and second transistor as a common gate amplifier with respect to the signal formed on the sensor resistor.

16. The amplifying circuit arrangement of claim 15, wherein each of the first and second transistor have a control electrode being selectively driven to apply a bias voltage by the respective first and second bias voltage through a respective first and second bias amplifier, connected at the other input to a terminal of the sensor resistor.

17. The amplifying circuit arrangement of claim 15, further comprising a further current loop comprising an amplifier configured to compare a voltage on the load resistance to a reference voltage and adjust the value of the current issued by the current generator to regulate the current in the first differential pair of transistors in the voltage bias mode.

18. The amplifying circuit arrangement of claim 15, further comprising a current loop configured to apply a current bias to the sensor resistor comprising a circuit arrangement to sum or respectively subtract a bias current to a current sunken by each of the current generators of the first differential pair of transistors.

19. A hard disk drive arrangement comprising:
   a thermal resistor configured to perform sensing and control of fly height of a tip in the hard disk drive; and
   a circuit configured to synthesize a resistor having a resistance value having a variation in time equivalent to a resistance variation of the thermal resistor applied with a resistance bias voltage and a resistance current bias, wherein the circuit comprises:
   an amplifier comprising an input transistor;
   a bias current generator comprising a control node coupled to an output of the input transistor, wherein the bias current generator is configured to generate a bias current flowing in the input transistor; and
   a further current generator configured to generate a current at least proportional to the resistance bias current and coupled to the output of the input transistor, wherein the resistance bias voltage is applied to an input of the amplifier, and wherein a transconductance of the input transistor is at least proportional to the resistance of the thermal resistor.

* * * * *